(12) United States Patent
Caris et al.

(10) Patent No.: US 9,842,982 B2
(45) Date of Patent: Dec. 12, 2017

(54) PIEZOELECTRIC ACTUATOR ARRAY

(71) Applicant: Océ-Technologies B.V., Venlo (NL)

(72) Inventors: Johannes L. M. Caris, Heythuysen (NL); Johannes T. M. Hermans, Reuver (NL); Robert N. J. Jacobs, Maasbree (NL); Peter J. M. Janssen, Echt (NL)

(73) Assignee: OCÉ-TECHNOLOGIES B.V., Venlo (NL)

( * ) Notice: Subject to any disclaimer, the term of this patent is extended or adjusted under 35 U.S.C. 154(b) by 509 days.

(21) Appl. No.: 14/531,475

(22) Filed: Nov. 3, 2014

(65) Prior Publication Data

US 2015/0137664 A1 May 21, 2015

(30) Foreign Application Priority Data

Nov. 19, 2013 (EP) .................................... 13193490

(51) Int. Cl.
*H01L 41/053* (2006.01)
*H01L 41/09* (2006.01)
(Continued)

(52) U.S. Cl.
CPC .......... *H01L 41/09* (2013.01); *B41J 2/14209* (2013.01); *B41J 2/14233* (2013.01); *B41J 2/14274* (2013.01); *B41J 2/1609* (2013.01); *B41J 2/1623* (2013.01); *B41J 2/1632* (2013.01); *H01L 41/047* (2013.01); *H01L 41/23* (2013.01); *H01L 41/31* (2013.01); *H01L 41/313* (2013.01); *B41J 2002/14217* (2013.01); *B41J 2002/14491* (2013.01); *H01L 41/0475* (2013.01); *H01L 41/083* (2013.01); *Y10T 29/42* (2015.01)

(58) Field of Classification Search
CPC ....... B06B 1/06; B06B 1/0603; B06B 1/0611; B06B 1/0692; H01L 41/047; H01L 41/0475
USPC .......................................... 310/322, 334, 335
See application file for complete search history.

(56) References Cited

U.S. PATENT DOCUMENTS

| 2002/0044180 A1 | 4/2002 | Kitahara et al. |
| 2003/0076385 A1 | 4/2003 | Okazawa et al. |
| | (Continued) | |

FOREIGN PATENT DOCUMENTS

| DE | 20 2012 012 009 U1 | 2/2013 |
| WO | WO 2012/072114 A1 | 6/2012 |

*Primary Examiner* — Derek Rosenau
(74) *Attorney, Agent, or Firm* — Birch, Stewart, Kolasch & Birch, LLP

(57) ABSTRACT

A piezoelectric actuator array includes a substrate plate with a number of signal leads and at least one common lead, and a number of piezoelectric bodies arranged in a row on one surface of the substrate plate and formed by dividing a common piezoelectric block. The piezoelectric bodies include a number of active bodies each of which has, on a first side of the row, a signal electrode in contact with one of the signal leads and, on an opposite second side of the row, a common electrode in contact with the common lead. The substrate plate has at least one connector lead disposed on the first side of the row and electrically connected to the common lead on the second side of the row. At least one piezoelectric body has a conductive outer surface layer that establishes an electrically conductive path from the connector lead to the common lead.

9 Claims, 5 Drawing Sheets

(51) Int. Cl.
*B41J 2/14* (2006.01)
*B41J 2/16* (2006.01)
*H01L 41/23* (2013.01)
*H01L 41/31* (2013.01)
*H01L 41/313* (2013.01)
*H01L 41/047* (2006.01)
*H01L 41/083* (2006.01)

(56) References Cited

U.S. PATENT DOCUMENTS

2003/0187356 A1* 10/2003 Wakabayashi ........ B06B 1/0622
    600/437
2003/0222945 A1 12/2003 Nagata et al.

* cited by examiner

PIEZOELECTRIC ACTUATOR ARRAY

FIELD OF THE INVENTION

The invention relates to a piezoelectric actuator array comprising a substrate plate with a number of signal leads and at least one common lead formed on at least one surface thereof, and a number of piezoelectric bodies arranged in a row on one surface of the substrate plate and formed by dividing a common piezoelectric block, said piezoelectric bodies comprising a number of active bodies each of which has, on a first side of said row, a signal electrode in contact with one of said signal leads and, on an opposite second side of the row, a common electrode in contact with said common lead, said substrate plate having at least one connector lead disposed on the first side of the row and electrically connected to the common lead on the second side of the row.

BACKGROUND ART

Actuator arrays of this type may be used for example in piezoelectric ink jet devices. Then, each of the active piezoelectric bodies will be associated with an ink chamber and a nozzle and serves as an actuator for creating an acoustic pressure wave in the liquid ink in the associated ink chamber so that an ink droplet is expelled from the corresponding nozzle.

The signal leads may be used for applying a voltage to the signal electrode of a selected one of the actuators, whereas the common electrodes of all piezoelectric bodies are grounded via the common lead. Thus, in the actuator to which the voltage has been applied, a voltage drop will occur across the piezoelectric material, causing the same to expand or contract and thereby to generate the pressure wave.

In order for the actuator array to be more easily connected to an electronic control circuit, it is frequently desired that all electrical connectors are disposed on only one side of the row of piezoelectric bodies. Then, the common lead on the second side of the row has to be connected to the connector lead on the first side without short-circuiting any of the signal leads or signal electrodes.

WO 2012/072114 A1 discloses an actuator array in which the connector lead is disposed outside of an active range of the array, so that the connector lead may be connected to the common lead via an extension that bypasses the active range of the array. On the surface of the substrate plate, the signal leads, the common lead and the connector lead with its extension to the common lead form a relatively complicated pattern that may be formed by means of lithographic processes.

It is an object of the invention to provide an actuator array that can be produced more easily and at lower costs.

SUMMARY OF THE INVENTION

In order to achieve this object, according to the invention, the piezoelectric bodies comprise at least one piezoelectric body with a conductive outer surface layer that establishes an electrically conductive path from the connector lead to the common lead.

As a consequence, the connector lead and the common leads may be configured as straight conductive paths that are separated from one another by a gap and can easily be formed on the surface of the substrate without need for costly lithographic techniques. When the piezoelectric bodies are mounted on the substrate plate, the gap between the contact lead and the common lead will be bridged by the conductive surface layer that is formed on an outer surface of at least one of the piezoelectric bodies.

More specific optional features of the invention are indicated in the dependent claims.

The piezoelectric body that has the conductive outer surface layer may be one of the active bodies but may also be an inactive body that is not used as an actuator and has the only purpose to electrically connect the connector lead to the common lead. The at least one inactive piezoelectric body may be provided at one end or both ends of the row of active piezoelectric bodies. The conductive surface layer will originally be formed on a surface or surface portion of the common piezoelectric block which is then divided into the row of piezoelectric bodies, e.g. by dicing.

The invention also relates to a method of manufacturing a piezoelectric actuator array of the type described above.

BRIEF DESCRIPTION OF THE DRAWINGS

Embodiment examples will now be described in conjunction with the drawings, wherein.

DETAILED DESCRIPTION OF THE DRAWINGS

Figure 1:
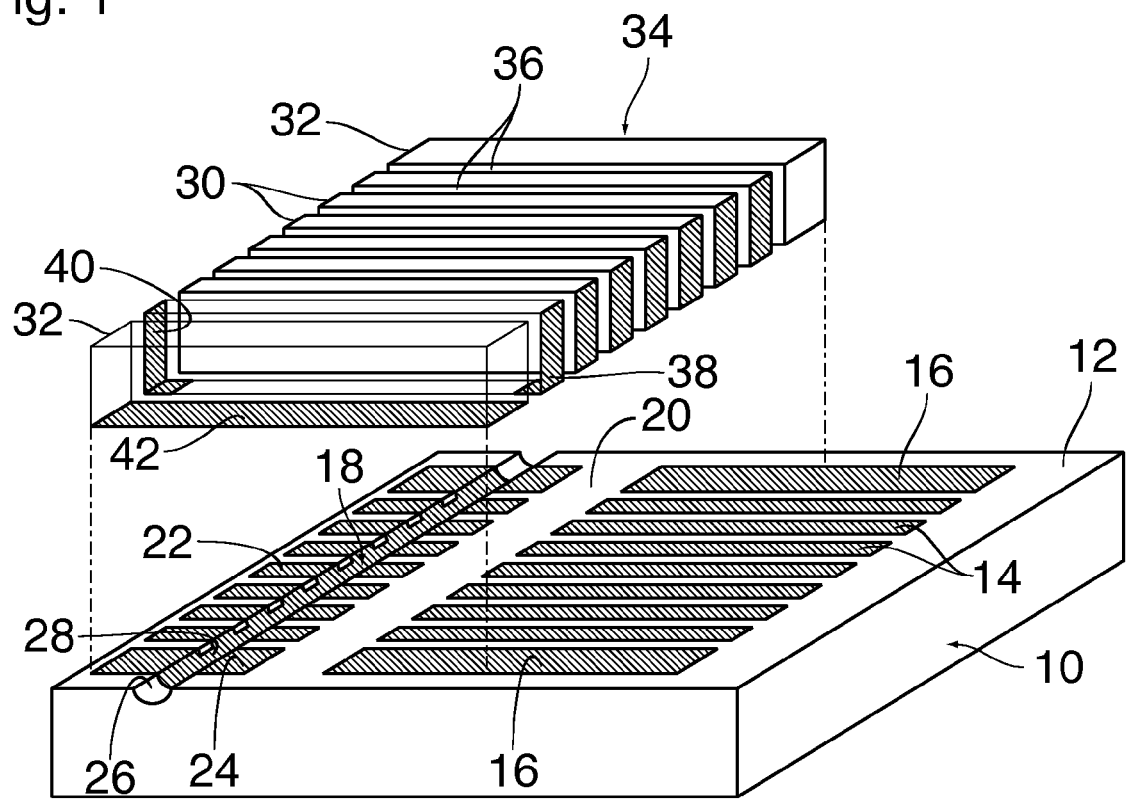
FIG. 1 is a perspective exploded view of an actuator array according to the invention.

The piezoelectric electric array shown in FIG. 1 comprises a ceramic substrate plate 10 having a top surface 12 with a pattern of electrically conductive leads 14, 16 and 18 formed thereon. These leads comprise a number of signal leads 14 configured as straight parallel paths arranged side by side, and two connector leads 16 also configured as straight paths and arranged in parallel with the signal leads 14 at either end of the row of the signal leads. The lead pattern further comprises a common lead 18 that is separated from the signal leads 14 and connector leads 16 by a gap 20. The common lead 18 forms a number of pads 22, 24 which may be considered as extensions of the signal leads 14 and the connector leads 16, respectively, but are separated therefrom by the gap 20.

A groove 26 is formed in the surface 12 of the substrate plate and arranged to cross each of the pads 22 and 24. The bottom of the groove 26 is coated with a conductive layer 28 that interconnects all the pads 22, 24.

A number of piezoelectric bodies 30, 32 are bonded to the top surface 12 of the substrate 10 and arranged in a row 34. The individual piezoelectric bodies 30, 32 are separated from one another by cuts 36, e. g. dicing cuts, and are disposed such that each of the bodies 30, 32 bridges the gap 20 between one of the signal leads 14 and connector leads 16, respectively, and one of the pads 22, 24 of the common lead 18.

The piezoelectric bodies 30, 32 comprise a number of active bodies 30 aligned with the signal leads 14, and two inactive bodies 32 aligned with the connector leads 16. In this simplified example, the number of active bodies 30 is seven, but the number will be significantly larger in a practical embodiment. In FIG. 1 the first one of the inactive bodies 32 and the first of the active bodies 30 has been shown transparent for illustration purposes.

Each of the active bodies 30 has a signal electrode 38 formed by an electrically conductive (metal) layer formed on an end face of the body 30 on a first side of the row 34 facing the signal and connector leads 14, 16, and also on an edge strip of the bottom face of the body 30 facing the top surface 12 of the electrode plate 10. With this edge strip, the signal electrode 38 makes contact with the associated signal lead 14.

Similarly, a common electrode 40 is formed at the opposite side of each active body 30, i.e. on a second side of the row 34 facing away from the signal and connector leads 14, 16. The common electrode 40 makes contact with one of the pads 22 of the common lead 18.

Each of the two inactive piezoelectric bodies 32 has an electrically conductive surface layer 42 on its bottom face which faces the top surface 12 of the substrate body 10. The layer 42 bridges the gap 20 and makes contact with both the associated connector lead 16 and the associated pad 26 of the common electrode 18.

Figure 2:
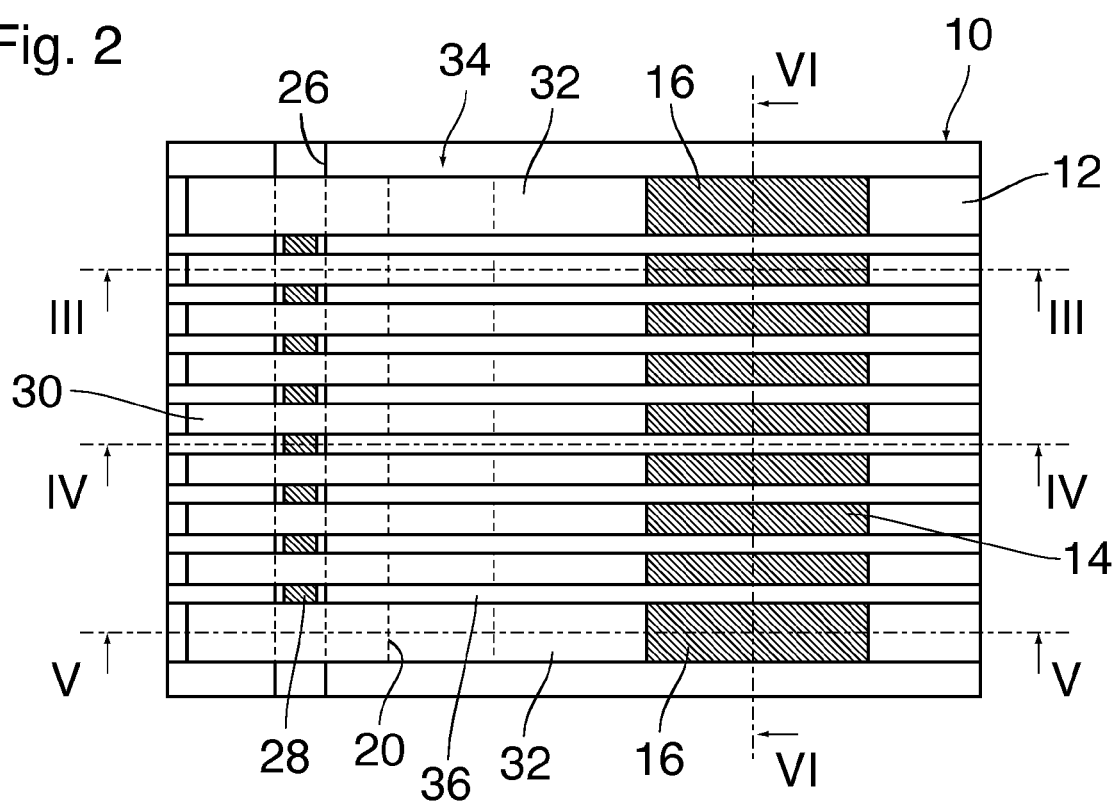
FIG. 2 is a top plan view of the actuator array shown in FIG. 1.

As has been shown in the top plan view in FIG. 2 (but for simplicity not in the perspective view in FIG. 1), the dicing cuts 36 separating the piezoelectric bodies 30, 32 cut also to some extent into the top surface 12 of the substrate plate 10, thereby separating the signal leads 14 and connector leads 16 as well as the pads 22, 24 from one another, without however severing the conductive layer 28 at the bottom of the groove 26.

Figure 3:
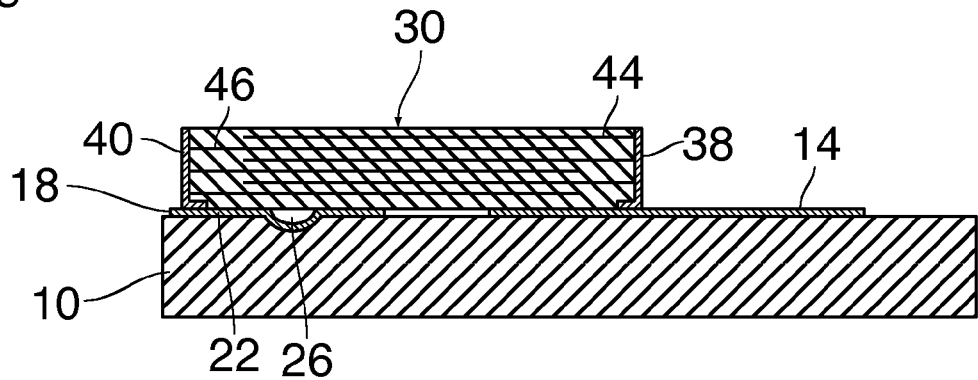
FIG. 3 is a cross-sectional view taken along the line III-III in FIG. 2.

FIG. 3 is a sectional view of one of the active piezoelectric bodies 30, showing the signal electrode 38 in electrical contact with the signal lead 14 and the common electrode 40 in electrical contact with the common lead 18. In this example, the piezoelectric body 30 has a number of parallel internal electrodes 44 and 46 that are connected alternatingly to the signal electrode 38 and the common electrode 40.

Figure 4:
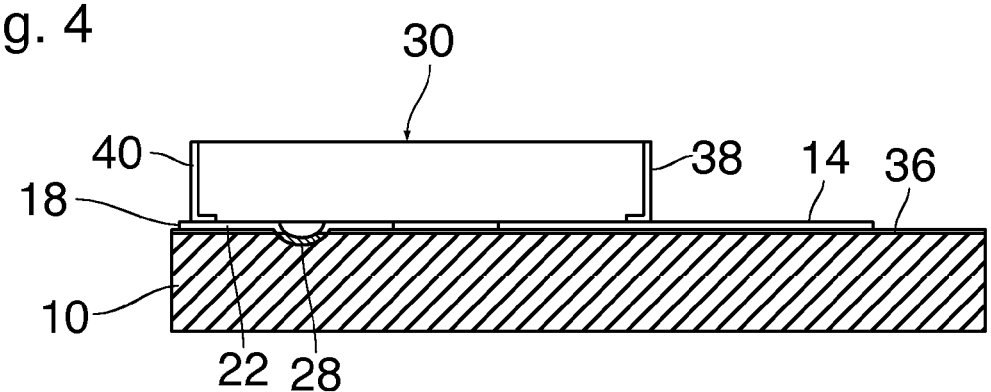
FIG. 4 is a cross-sectional view taken along the line IV-IV in FIG. 2.

FIG. 4 is a sectional view taken along one of the dicing cuts 36. It can be seen here that the conductive layer 28 of the common electrode 18 is arranged below the dicing cut 36 so that it may interconnect the pads 22 with one another and also with the pads 24.

Figure 5:
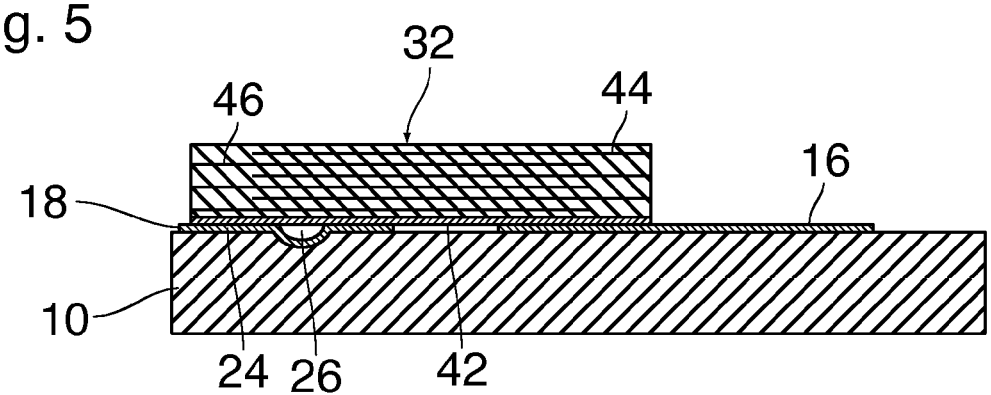
FIG. 5 is a cross-sectional view taken along the line V-V in FIG. 2.
Figure 6:
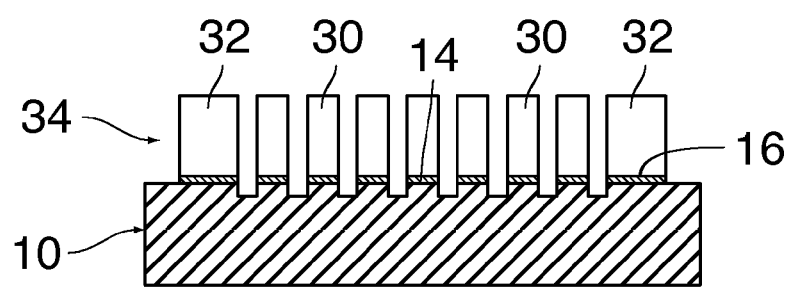
FIG. 6 is a longitudinal section taken along the line VI-VI in FIG. 2.

FIG. 5 is a sectional view of one of the inactive piezoelectric bodies 32 and illustrates how the conductive layer 42 at the bottom of this body 32 establishes an electrically conductive path from the connector lead 16 to the common lead 18. Thus, since the common lead 18 interconnects the common electrodes 40 of all active bodies 30, all common electrodes 40 will be held at the potential that is applied to the connector leads 16. For example, when the connector leads 16 are grounded (or one of them is grounded and the other one is left unconnected), all common electrodes 40 will be held at ground potential. Then, when a non-zero voltage is applied to one of the signal leads 14 for one of the active piezoelectric bodies 30, this voltage will be applied to the internal electrodes 44 via the signal electrode 38, so that an electric field is established in the piezoelectric material between each pair of internal electrodes 44, 46, and these electric fields cause the piezoelectric body to expand or contract or bend.

As is shown in FIG. 5, the internal electrodes 44 and 46 are also provided in the inactive piezoelectric body 32 but have no technical function because the body 32 is not provided with a signal electrode and a common electrode. The internal electrodes 44 and 46 in the inactive body 32 are just a result of a specific manufacturing process that will be described later.

Optionally, the inactive bodies 32 may also be provided with signal and common electrodes equivalent to the signal and common electrodes 38, 40 of the bodies 30. Then, the signal electrode of the body 32 would be grounded via the connector lead 16, so that the internal electrodes 44, 46 would still be functionless.

Optionally, it is even possible to use the piezoelectric bodies 32 having the conductive layers 42 as active bodies (i. e. as actuators), if a suitable structure is provided for isolating the signal electrode from the connector lead 16 and connecting it to an additional signal lead.

A method of manufacturing the piezoelectric actuator array that has been described above will now be explained by reference to FIGS. 7 and 8.

Figure 7:
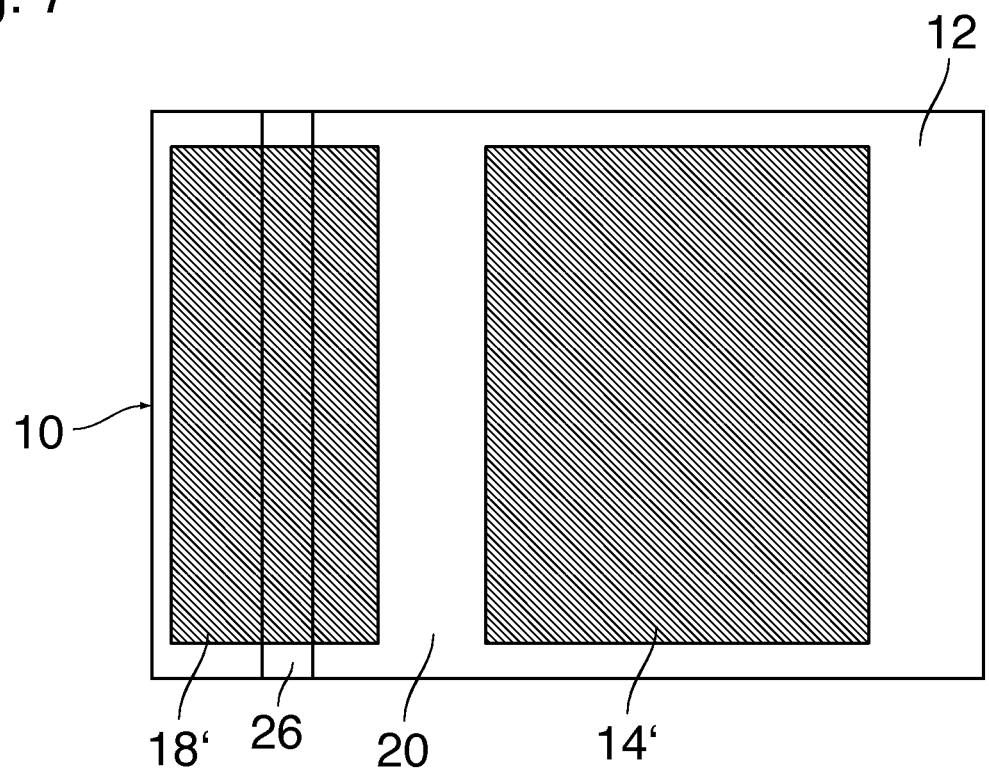
FIG. 7 is a top plan view of a substrate plate obtained in an intermediate step of a production process for the actuator array.

First, the groove 26 is cut into the top surface 12 of the substrate plate 10 as has been shown in FIG. 7. Then, a metallization is provided on two rectangular areas 14' and 18' on the top surface 12. The area 14' is to form the signal leads 14 and the connector leads 16 whereas the area 18' extends over the groove 26 (with the walls of this groove also being metallised) and is to form the common lead 18. Optionally, the top surface 12 of the substrate plate 10 may be metallised in its entirety and then a swath of the metallization is milled or ground away in order to form the gap 20 and, optionally, non-metallised margins at the edges of the substrate plate.

Although not shown in the drawing, a plurality of substrate plates 10 may be formed from a common ceramic wafer, and the steps of forming the groove 26 and the metallised areas 14', 18' may be performed commonly for the plurality of substrate plates before the wafer is divided into the individual plates. It will be observed however that no costly lithographic procedures such as masking, exposure, etching and the like are needed for forming the metallised areas 14' and 18', because these areas have simple (rectangular) geometric shapes and the gap 20 separating the two areas may be formed continuously from one edge of the plate to the other.

Figure 8:
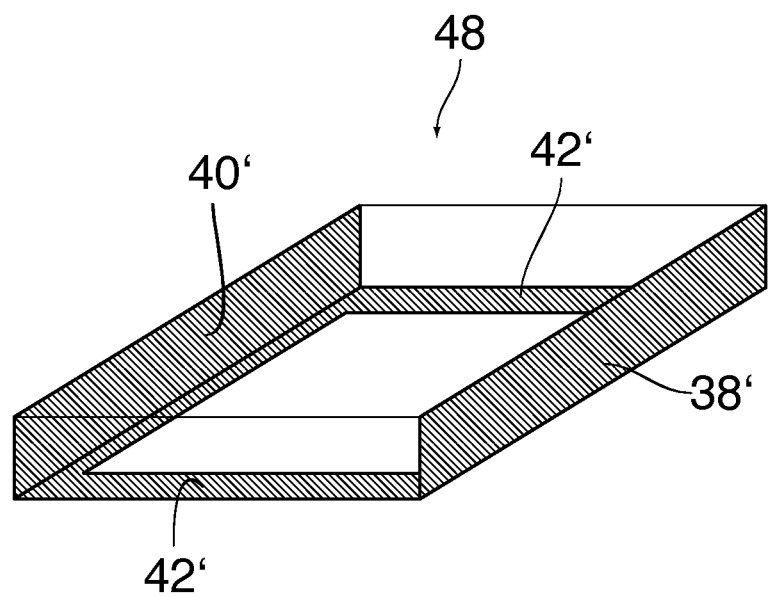
FIG. 8 is a schematic perspective view of a piezoelectric block to be bonded to the substrate plate shown in FIG. 7.

Then a cuboid block 48 of piezoelectric ceramics is prepared and metallised with a pattern as shown in FIG. 8, where the block 48 has been shown as a transparent body. The block 48 is to form the entire row 34 of piezoelectric bodies 30, 32. A metallization layer 38' formed continuously along one edge of the block is a precursor for the signal electrodes 38, and a metallization layer 40' formed continuously at the opposite edge is a precursor for the common electrodes 40. In this example, the metallization layers 38' and 40' extend also to the ends of the block that will later form the inactive piezoelectric bodies 32.

In a same or another metallization step, two metallised bands 42' are formed on the bottom face of the block 48 along the edges that extend in transverse direction of the block 48. These bands 42' are to form the conductive surface layers 42 on the inactive bodies 32.

In a subsequent step, the block 48 is bonded to the top surface 12 of the substrate plate 10 in the configuration shown in FIG. 1, and then the dicing cuts 36 are formed so as to divide the block 48 into the piezoelectric bodies 30, 32 and to separate the area 14' into the leads 14, 16 and thereby completing the actuator array.

Figure 9:
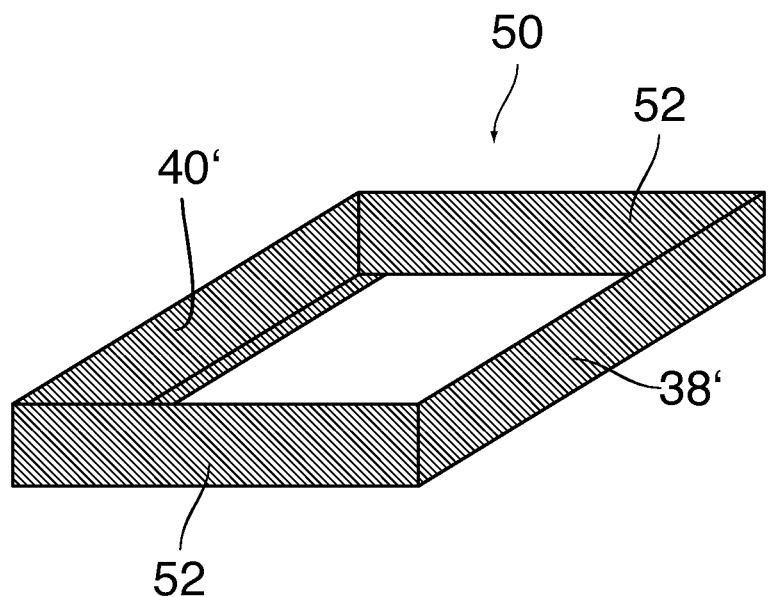
FIGS. 9 and 10 are views analogous to FIG. 8 for actuator arrays according to modified embodiments.

FIG. 9 shows a block 50 that may be used as a substitute for the block 48 shown in FIG. 8 and has a different metallization pattern for forming an actuator array according to a modified embodiment. In this embodiment, the bands 42' shown in FIG. 8 are omitted and, instead, the end faces of the block 50 are metallised so as to form electrically conductive surface layers 52 that will later form the outer side walls of the inactive piezoelectric bodies 32 at the opposite ends of the row 34. In another embodiment, only one end face may be metallised. In the illustrated case, the metallization layers 38' and 40' are extended to the opposite ends of the block 50, and when the dicing cuts have been formed, the inactive bodies 32 will have electrodes that correspond to the signal electrodes 38 and the common electrodes 40 of the active bodies 30 and are in electrical contact with the connector leads 16 and the common lead 18, respectively. Since the conductive layers 52 are connected to these electrodes, the inactive bodies 32 will again establish an electrically conductive path from the connector lead 16 to the common lead 18.

Figure 10:
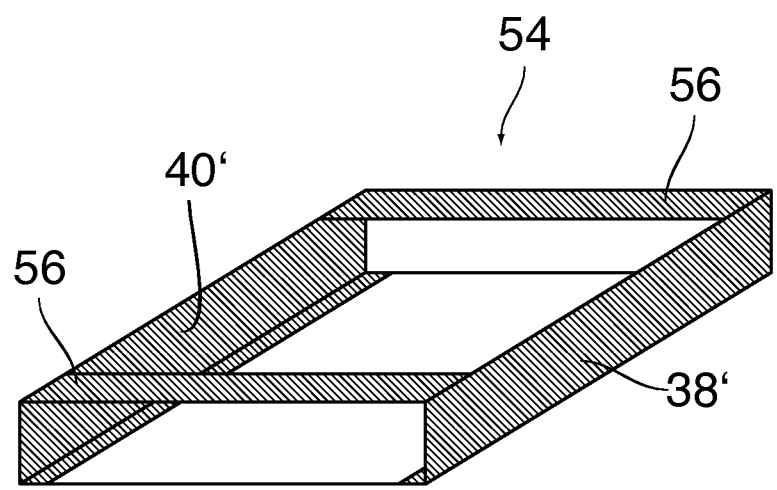

FIG. 10 illustrates a block 54 wherein the conductive layers 52 of the block 50 shown in FIG. 9 are replaced by conductive layers 56 on the top surface of the block. Again, these layers 56 are connected to the electrodes on both sides of the inactive bodies 32 and thereby establish an electrically conductive path from the connector lead 16 to the common lead 18.

Figure 11:
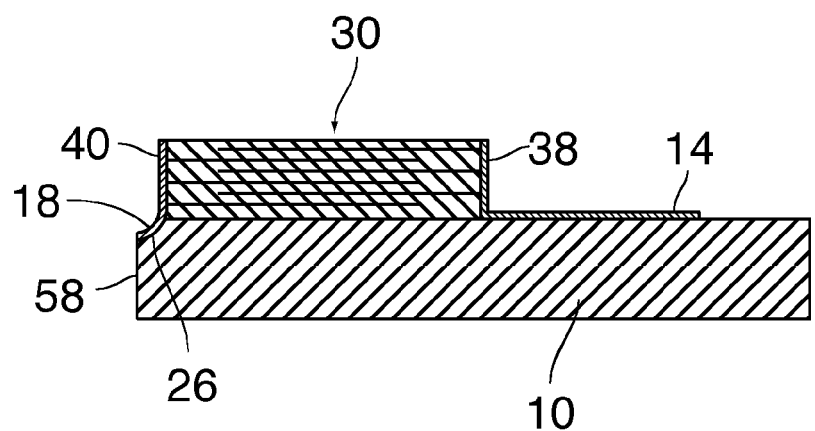
FIG. 11 is a cross-sectional view analogous to FIG. 3, but for a modified embodiment.

FIG. 11 illustrates an embodiment in which the groove 26 is formed along an edge face 58 of the substrate plate 10 and the common lead 18 is formed essentially by a metallization on the wall of the groove 26. The common electrode 40 and the common lead 18 may be formed in a single metallization step after the piezoelectric block has been bonded to the substrate plate. Similarly, the precursors for signal electrodes 38, the signal leads 14, and the connector leads 16 may be formed in a single metallization step after bonding and before dicing.

Figure 12:
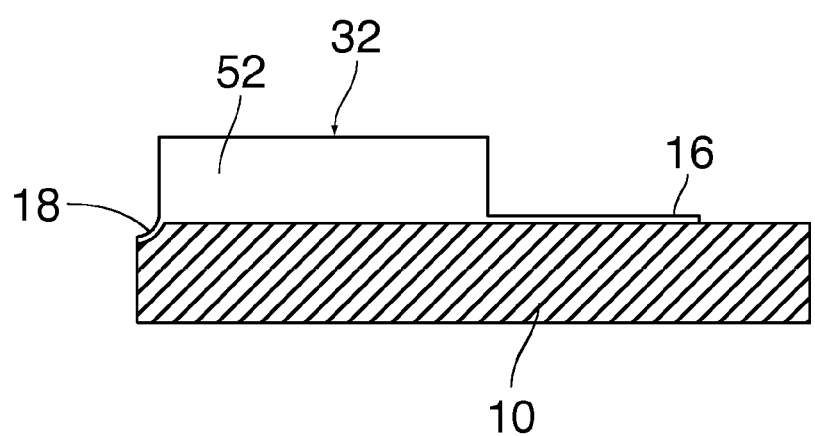
FIG. 12 is a side view of a piezoelectric body in the embodiment shown in FIG. 11.

FIG. 12 is a side view one of the inactive piezoelectric bodies 32 in the embodiment according to FIG. 11. As in FIG. 9, the conductive outer surface layer 52 is formed on a side face of the body 32.

Figure 13:
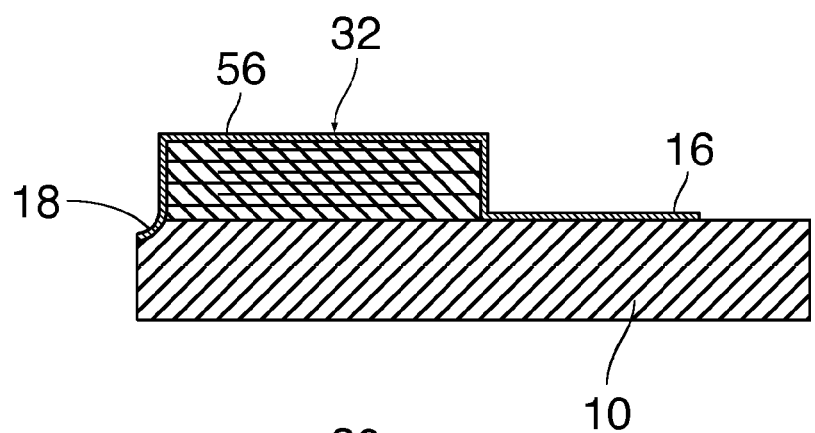
FIG. 13 is a cross-sectional view analogous to FIG. 5, but for another embodiment.

FIG. 13 illustrates a modified example which differs from FIG. 12 in that the conductive outer surface layer 56 is formed on the top face of the body 32, similarly as in FIG. 10.

Figure 14:
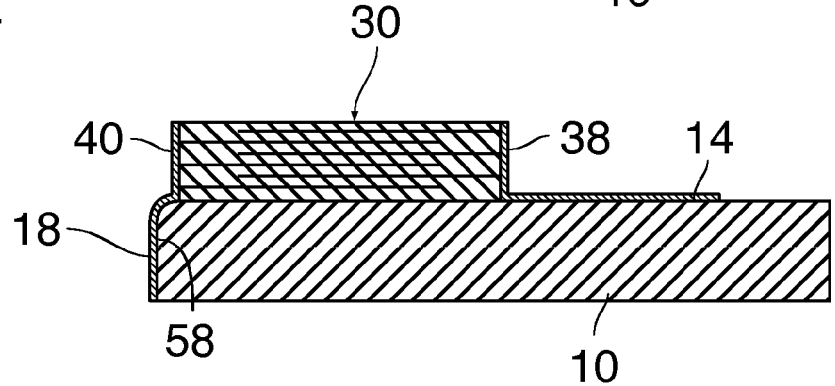
FIG. 14 is a cross-sectional view analogous to FIG. 3, but for yet another embodiment.

FIG. 14 shows yet another embodiment in which the common lead 18 is formed mainly on the edge face 58 of the substrate plate.

The invention claimed is:

1. A piezoelectric actuator array comprising a substrate plate with a number of signal leads and at least one common lead formed on at least one surface thereof, and a number of piezoelectric bodies arranged in a row on one surface of the substrate plate and formed by dividing a common piezoelectric block, said piezoelectric bodies comprising a number of active bodies each of which has, on a first side of said row, a signal electrode in contact with one of said signal leads and, on an opposite second side of the row, a common electrode in contact with said common lead, said substrate plate having at least one connector lead disposed on the first side of the row and electrically connected to the common lead on the second side of the row, characterized in that said piezoelectric bodies comprise at least one piezoelectric body with a conductive outer surface layer that establishes an electrically conductive path from the connector lead to the common lead,
   wherein said number of piezoelectric bodies are arranged directly on said at least one surface, on which said number of signal leads and at least one common lead are formed, of the substrate plate, and a longitudinal axis of each of said number of piezoelectric bodies is parallel with said at least one surface.

2. The array according to claim 1, wherein said at least one piezoelectric body having said conductive outer surface layer is an inactive body that is not connected to any of the signal leads.

3. The array according to claim 1, wherein said conductive outer surface layer comprises a layer formed on a bottom face of the piezoelectric body facing said surface of the substrate plate.

4. The array according to claim 1, wherein said conductive outer surface layer comprises a layer on a side surface of the piezoelectric body that extends normal to said surface of the substrate plate.

5. The array according to claim 1, wherein said conductive outer surface layer comprises a layer on a top surface of the piezoelectric body facing away from the substrate plate.

6. The array according to claim 1, wherein at least a part of said common lead is formed on an edge face of the substrate plate adjacent to said one surface thereof.

7. A method of manufacturing the piezoelectric actuator array according to independent claim 1, the method comprising the steps of:
   providing a piezoelectric block with conductive layers serving as precursors for the signal electrodes and common electrodes,
   providing said block with at least one electrically conductive outer surface layer;
   bonding said block to said one surface of the substrate plate in a position in which said conductive surface layer establishes an electrically conductive path from the connector lead to the common lead; and
   forming cuts in said block in order to divide the same into the individual piezoelectric bodies.

8. The method according to claim 7, wherein said signal leads, connector lead and common lead are obtained by providing, on said surface of the substrate plate, at least two electrically conductive areas that are separated by a gap, said gap extending continuously from one edge of the substrate plate to an opposite edge of the substrate plate.

9. A method of manufacturing the piezoelectric actuator array according to independent claim 1, wherein the method comprises the steps of:
   bonding a piezoelectric block to said one surface of the substrate plate;
   forming a conductive layer which serves as a precursor for the signal electrodes, the signal leads, and said at least one connector lead on one side of the piezoelectric block and on the substrate plate, and forming a conductive layer which serves as a precursor for the common electrode and the common lead on an opposite side of the piezoelectric block and on the substrate plate, and forming said at least one electrically conductive outer surface layer on said piezoelectric block so as to be electrically connected to the at least one connector lead and the common lead; and forming cuts in said block in order to divide the same into the individual piezoelectric bodies.

\* \* \* \* \*